United States Patent
Park et al.

(10) Patent No.: US 8,723,310 B2
(45) Date of Patent: May 13, 2014

(54) INTEGRATED CIRCUIT PACKAGING SYSTEM HAVING WARPAGE PREVENTION STRUCTURES

(75) Inventors: YiSu Park, Icheon-si (KR); KyungHoon Lee, Icheon (KR); JoungIn Yang, Seoul (KR); SangMi Park, Pucheon-Si (KR); DaeSik Choi, Seoul (KR)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 13/526,877

(22) Filed: Jun. 19, 2012

(65) Prior Publication Data
US 2013/0334714 A1  Dec. 19, 2013

(51) Int. Cl.
*H01L 23/10* (2006.01)

(52) U.S. Cl.
USPC ........... 257/706; 257/675; 257/669; 257/717; 257/720

(58) Field of Classification Search
USPC .......... 257/669, 675, 706, 717, 720; 438/108, 438/110, 113, 118, 121–123
See application file for complete search history.

(56) References Cited

U.S. PATENT DOCUMENTS

| | | | |
|---|---|---|---|
| 5,331,205 A * | 7/1994 | Primeaux | 257/790 |
| 6,699,731 B2 * | 3/2004 | Huang et al. | 438/108 |
| 2007/0273019 A1 | 11/2007 | Huang et al. | |
| 2010/0320624 A1 | 12/2010 | Kang et al. | |
| 2012/0056334 A1 | 3/2012 | Yang et al. | |
| 2013/0154079 A1 * | 6/2013 | Kim et al. | 257/706 |

* cited by examiner

*Primary Examiner* — Dung A. Le
(74) *Attorney, Agent, or Firm* — Ishimaru & Associates LLP (57) ABSTRACT

A method of manufacture of an integrated circuit packaging system includes providing a substrate; connecting an integrated circuit die; forming a molding having a temperature-dependent characteristic directly on the top surface of the substrate; and forming a coupling encapsulation having a coupled characteristic different from the temperature-dependent characteristic directly on the molding forms an encapsulation boundary between the coupling encapsulation and the molding.

10 Claims, 4 Drawing Sheets

INTEGRATED CIRCUIT PACKAGING SYSTEM HAVING WARPAGE PREVENTION STRUCTURES

TECHNICAL FIELD

The present invention relates generally to an integrated circuit packaging system, and more particularly to a system having a warpage prevention mechanism.

BACKGROUND ART

Increased miniaturization of components, greater packaging density of integrated circuits ("ICs"), higher performance, and lower cost are ongoing goals of the computer industry. Semiconductor packaging structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, IC packages that are incorporated into these devices are required to be made smaller and thinner. The packaging configurations that house and protect IC require them to be made smaller and thinner as well.

Thus, a need still remains for an integrated circuit packaging system with lead-frame grid-array mechanism providing low cost manufacturing, improved yields, reduction of integrated circuit packaging dimensions, and flexible stacking and integration configurations. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a substrate; connecting an integrated circuit die; forming a molding having a temperature-dependent characteristic directly on the top surface of the substrate; and forming a coupling encapsulation having a coupled characteristic different from the temperature-dependent characteristic directly on the molding forms an encapsulation boundary between the coupling encapsulation and the molding.

The present invention provides an integrated circuit packaging system including: a substrate; an integrated circuit die connected to the substrate; a molding having a temperature-dependent characteristic formed directly on a top surface of the substrate; a coupling encapsulation having a coupled characteristic different from the temperature-dependent characteristic, with the coupling encapsulation formed directly on the molding; and an encapsulation boundary formed between and directly on the molding and the coupling encapsulation.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown greatly exaggerated in the drawing FIGs. The depictions in the FIGs. are arbitrary for the most part. Generally, the invention can be operated in any orientation. In addition, where multiple embodiments are disclosed and described having some features in common, for clarity and ease of illustration, description, and comprehension thereof, similar and like features one to another will ordinarily be described with like reference numerals.

For expository purposes, the term "horizontal" as used herein is defined as a plane parallel to the plane of an active surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct physical contact between elements. The term "directly on" means there is direct physical contact between elements with no intervening elements. The term "processing" as used herein includes deposition of material, patterning, exposure, development, etching, cleaning, molding, and/or removal of the material or as required in forming a described structure.

Figure 1:
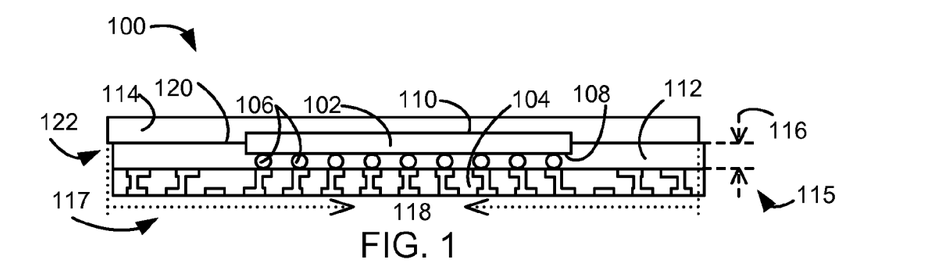
FIG. 1 is a cross-sectional view of an integrated circuit packaging system along a line 1-1 of FIG. 2 in a first embodiment of the present invention.
Figure 2:
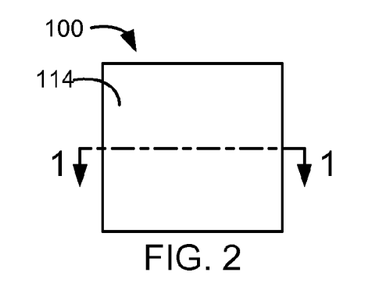
FIG. 2 is a top view of the integrated circuit packaging system.

Referring now to FIG. 1, therein is shown a cross-sectional view of an integrated circuit packaging system 100 along a line 1-1 of FIG. 2 in a first embodiment of the present invention. The integrated circuit packaging system 100 can have an integrated circuit die 102, a substrate 104, and an internal interconnect 106.

The integrated circuit die 102, such as a flip chip or a wire bond die, can be mounted over the substrate 104. The substrate 104, such as a printed circuit board, a laminated substrate, or a ceramic based structure, can include various portions. For example, the substrate 104 can have a non-conductive portion, such as an inner support layer or a pre-impregnated layer, or a conductive portion, such as a via, a trace, a pad, or a combination thereof. Also, for example, the substrate 104 can include multiple layers, such as involving a support layer, a solder resist layer, a metal layer, a dielectric layer, or a combination thereof.

The integrated circuit die 102 can have an active side 108 and a passive side 110. The active side 108 is defined as the surface having a structure for electrically connecting the integrated circuit die 102. For example, the active side 108 can be the side having pads or bumps for connecting the integrated circuit die 102 to other components or structures. The active side 108 can be the active surface of the integrated circuit die 102. The passive side 110 can be a surface of the integrated circuit die 102 opposite to the active side 108.

The integrated circuit die 102 can be connected to the substrate 104 through the internal interconnect 106, such as a bond wire or a solder bump. The internal interconnect 106 can be conductive and can be used to relay electrical signal, power, ground, or reference potential between the integrated circuit die 102 and the conductive portion of the substrate 104.

The integrated circuit packaging system 100 can have a molding 112 and a coupling encapsulation 114. The molding 112 is defined as an epoxy material for protecting the integrated circuit packaging system 100. The molding 112 can be over the integrated circuit die 102, the substrate 104, the internal interconnect 106, or a combination thereof. The molding 112 can be directly on the substrate 104, the internal interconnect 106, the integrated circuit die 102 or a bottom portion thereof, or a combination thereof.

The coupling encapsulation 114 is defined as an epoxy material having different chemical composition or physical properties than the molding 112. For example, the coupling encapsulation 114 can have different chemical bonding or lattice arrangement or have different temperature-viscosity profile than the molding 112.

The coupling encapsulation 114 can be over the integrated circuit die 102, the substrate 104, the internal interconnect 106, the molding 112, or a combination thereof. The coupling encapsulation 114 can be can be directly on the integrated circuit die 102 or a top portion thereof, the molding 112, or a combination thereof.

The molding 112 and the coupling encapsulation 114 can be different in various ways. For example, the two structures can have different density, chemical composition, or a combination thereof.

The molding 112 can have a temperature-dependent characteristic 115. The temperature-dependent characteristic 115 is defined as a physical attribute, a characteristic, or a combination thereof that changes based on temperature. For example, the temperature-dependent characteristic 115 can include changes in size based on coefficient of thermal expansion (CTE), viscosity levels, arrangement of lattice structures, or a combination thereof.

The temperature-dependent characteristic 115 can include a base shrinkage 116. The base shrinkage 116 is defined as a representation of change in size of the molding 112 in response to temperature change. The base shrinkage 116 can be a percentage, a size measurement, a rate of change in size corresponding to temperature or a change in temperature, a range of values thereof, or a combination thereof.

For example, the base shrinkage 116 can be a percentage decrease in horizontal dimension, vertical dimension, or a combination thereof when the molding 112 goes from 150 degrees to 100 degrees Fahrenheit or with 10 degree Celsius change in an average temperature of the molding 112. Also, for example, the base shrinkage 116 can be a profile of the volume of the molding 112 at various temperatures.

The base shrinkage 116 can be the size and behavior, such as shrinking or expanding, of the molding 112 during manufacturing. For example, the base shrinkage 116 can be the change in size of the molding 112 corresponding to temperatures experienced during processes such as flowing, curing, solder reflow, or a combination thereof.

The base shrinkage 116 can affect the shape of the integrated circuit packaging device 100 due to mismatches in the CTE of various structures and components therein. The mismatches in the CTE can have the base shrinkage 116 cause the integrated circuit packaging device 100 to warp. For example, the substrate 104 can change from planar shape to a concave or convex shape.

The integrated circuit packaging device 100 can have the coupling encapsulation 114 selected to maintain the planar shape of the substrate 104 and prevent warpage in the integrated circuit packaging device 100. The coupling encapsulation 114 having different physical characteristics than the molding 112 can be selected. The differences in physical characteristics can counteract the effects of the molding 112 and the coupling encapsulation 114 to maintain the planar shape of the substrate 104 and prevent warpage in the integrated circuit packaging device 100.

The coupling encapsulation 114 can have a coupled characteristic 117. The coupled characteristic 117 is defined as a physical attribute, a characteristic, or a combination thereof that changes based on temperature. For example, the coupled characteristic 117 can include changes in size based on coefficient of thermal expansion (CTE), viscosity levels, arrangement of lattice structures, or a combination thereof.

The coupled characteristic 117 can include a coupled shrinkage 118. The coupled shrinkage 118 defined as a representation of change in size of the coupling encapsulation 114 in response to temperature change. The coupled shrinkage 118 can be a percentage, a size measurement, a rate of change in size corresponding to temperature or a change in temperature, a range of values thereof, or a combination thereof.

For example, the coupled shrinkage 118 can be a percentage decrease in horizontal dimension, vertical dimension, or a combination thereof when the coupling encapsulation 114 goes from 150 degrees to 100 degrees Fahrenheit or with 10 degree Celsius change in an average temperature of the coupling encapsulation 114. Also, for example, the coupled shrinkage 118 can be a profile of the volume of the coupling encapsulation 114 various temperatures.

The coupled characteristic 117 can be the same type of characteristic as the temperature-dependent characteristic 115 but have different magnitude or value. For example, the coupled shrinkage 118 can be of a greater or lesser value or rate than the base shrinkage 116. Also, for example, the coupled shrinkage 118 can have a different profile than the base shrinkage 116. For further example, the coupled characteristic 117 and the temperature-dependent characteristic 115 include glass transition temperatures of the molding 112 and the coupling encapsulation 114 that transition at different temperatures.

For illustrative purposes, the base shrinkage 116 is shown along a vertical direction and the coupled shrinkage 118 is shown along a horizontal direction. However, it is understood that the shrinkage can occur along the horizontal direction, the vertical direction, or a combination thereof for the molding 112, the coupling encapsulation 114, or a combination thereof.

Also, for illustrative purposes, the sizes of the arrows representing the base shrinkage 116 is shown as being smaller than those of the coupled shrinkage 118 to represent different rates of shrinkage. However, it is understood that the coupled shrinkage 118 can be greater than, equal to, or lesser than the base shrinkage 116.

The integrated circuit packaging system 100 can have the base shrinkage 116 of the molding 112 and the coupled shrinkage 118 of the coupling encapsulation 114 selected to prevent warpage during manufacturing. The base shrinkage 116 and the coupled shrinkage 118 can be selected to prevent or correct warpage during manufacturing of the integrated circuit packaging system 100.

For example, the molding 112 can have 0.2-0.4% for the base shrinkage 116 between flowing and curing and cause a convex or "crying" warpage in the molding 112, the substrate 104, or a combination thereof. The coupling encapsulation 114 having the coupled shrinkage 118 of 0.7-1.0% between flowing and curing can be selected and formed directly on the molding 112. The coupled shrinkage 118 can be selected to reinstate planar horizontal surface for the molding 112, the substrate 104, or a combination thereof and correct the warpage caused in forming the molding 112.

Also, for example, the molding 112 can have the base shrinkage 116 between operational temperature range and ambient temperature range that can cause a concave or "smiling" warpage in the integrated circuit packaging system 100. The coupling encapsulation 114 can be selected to have the coupled shrinkage 118 to counteract the forces caused by change in dimensions for the molding 112.

It has been discovered that the temperature-dependent characteristic 115 and the coupled characteristic 117, including the base shrinkage 116 and the coupled shrinkage 118, can be selected to provide improved warpage control while maintaining low manufacturing cost. The temperature-dependent characteristic 115 and the coupled characteristic 117 can be selected to have the molding 112 and the coupling encapsulation 114 counteract the effects of shrinkage caused by each other. The interaction between the two structures can further eliminate the need for additional stiffening or stress relieving structures in preventing warpage.

The integrated circuit packaging system 100 can have an encapsulation boundary 120, an irregular surface portion 122, or a combination thereof. The encapsulation boundary 120 is defined as a surface or surfaces directly on each other between the molding 112 and the coupling encapsulation 114. The encapsulation boundary can be planar or non-planar.

The encapsulation boundary 120 can be the surface resulting from a surface of the molding 112 directly on a coupling surface of the coupling encapsulation 114. The encapsulation boundary 120 can be a result or characteristic of forming the molding 112 and the coupling encapsulation 114 separately. The encapsulation boundary 120 can also be a result or characteristic of the differences in densities, chemical compositions, shrinkage rates, or a combination thereof between the molding 112 and the coupling encapsulation 114.

The encapsulation boundary 120 can extend in a non-horizontal direction, a non-vertical direction, or a combination thereof. The encapsulation boundary 120 can be located between the active side 108 and the passive side 110 and can be directly on a periphery non-horizontal surface of the integrated circuit die 102. The encapsulation boundary 120 can also be located above, below, or coplanar with the active side 108 or the passive side 110.

It has been discovered that the encapsulation boundary 120, as a characteristic or result of differences in characteristics between the molding 112 and the coupling encapsulation 114, provide improved warpage control while maintaining low manufacturing cost. The encapsulation boundary 120 can provide a scheme for utilizing the difference in characteristics between the molding 112 and the coupling encapsulation 114 to counteract each other to prevent warpage.

The irregular surface portion 122 is defined as a non-planar portion of a surface, such as an indentation or a protrusion. The irregular surface portion 122 can be located abutting or at the encapsulation boundary 120. The irregular surface portion 122 can have a surface or surfaces integral with the encapsulation boundary 120.

For example, the irregular surface portion 122 can be an indentation, a protrusion, or a combination thereof, on a non-horizontal surface along a periphery portion of the integrated circuit packaging system 100. The irregular surface portion 122 can be located where the molding 112 is directly on the coupling encapsulation 114 along the non-horizontal surface.

The irregular surface portion 122 can be a result or characteristic of forming the molding 112 and the coupling encapsulation 114 separately. The irregular surface portion 122 can also be a result or characteristic of the differences in densities, chemical compositions, the base shrinkage 116 and the coupled shrinkage 118, or a combination thereof between the molding 112 and the coupling encapsulation 114.

It has been discovered that the irregular surface portion 122, as a characteristic or result of differences in characteristics between the molding 112 and the coupling encapsulation 114 provide improved warpage control while maintaining low manufacturing cost. The difference in characteristics between the molding 112 and the coupling encapsulation 114 causing the irregular surface portion 122 can counteract each other to prevent warpage.

Referring now to FIG. 2, therein is shown a top view of the integrated circuit packaging system 100. The integrated circuit packaging system 100 can have the coupling encapsulation 114 on a top portion of the integrated circuit packaging system 100. The coupling encapsulation 114 can extend to a perimeter of the integrated circuit packaging system 100.

The coupling encapsulation 114 can also be between a non-horizontal outer surface of the integrated circuit packaging system 100 and a central portion of the integrated circuit packaging system 100. In such instances, the top view can show the molding 112 of FIG. 1, the substrate 104 of FIG. 1, or a combination thereof.

Figure 3:
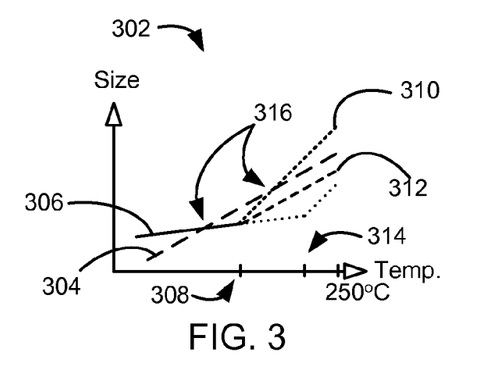
FIG. 3 is a temperature profile of the molding and the coupling encapsulation.

Referring now to FIG. 3, therein is shown a temperature profile 302 of various material used for manufacturing the integrated circuit packaging system 100 of FIG. 1. The temperature profile 302 can show a representation of a characteristic, such as size or expansion rate, of the various materials that can be used for manufacturing the integrated circuit packaging system 100 in various temperatures. For example, the temperature profile 302 can be a representation of the CTE for various materials. Also, for example, the temperature profile 302 can be a representation of the viscosity levels of various materials.

The temperature profile 302 can represent the characteristics using various methods. For example, the temperature profile 302 can have a vertical axis that represents a dimension, percentage increase, expansion amount or rate of a material. Also, for example, the temperature profile 302 can have a horizontal axis that represents environmental conditions, such as temperature, pressure, or a combination thereof.

The temperature profile 302 can show a substrate-material profile 304, a molding-profile 306. The substrate-material profile 304 is defined as a representation of a characteristic of the substrate 104 of FIG. 1 or the material or materials therein under various conditions.

For example, the substrate-material profile 304 can represent size, expansion rate, viscosity level, or a combination thereof in response to various temperatures, humidity level, pressure, or a combination thereof. Also, for example, the substrate-material profile 304 can be specific to a given mass, particular shape or design, corresponding operation or stage in the manufacturing process, or a combination thereof.

The molding-profile 306 is defined as a representation of a characteristic of the molding 112 of FIG. 1 under various conditions. For example, the molding-profile 306 can represent size, expansion rate, viscosity level, or a combination thereof in response to various temperatures, humidity level, pressure, or a combination thereof. Also, for example, the molding-profile 306 can be specific to a given mass, particular shape or design, corresponding operation or stage in the manufacturing process, or a combination thereof.

The temperature profile 302 can also show a transition temperature 308 of the molding 112. The transition temperature 308 is defined as a temperature level or a range of temperature levels for determining the physical characteristic of the molding 112. The temperature-dependent characteristic 115 of FIG. 1 can have the transition temperature 308. The transition temperature 308 can be the temperature level required to achieve a threshold level of viscosity defining glass-liquid transition for the molding 112. The transition temperature 308 can be the glass transition temperature of the molding 112.

The molding-profile 306 can show various responses at the transition temperature 308. For example, the molding-profile 306 can maintain a constant rate of change through the transition temperature 308 or have a higher or lower slope starting at the transition temperature 308.

The temperature profile 302 can be used to characterize the warpage behavior of the molding 112 and the substrate 104 during the manufacturing process. For example, the combination of the molding 112 and the substrate 104 can have the crying warpage when the molding-profile 306 is greater than the substrate-material profile 304 and the smiling warpage when the molding-profile 306 is less than the substrate-material profile 304.

Also, for example, the molding 112 having the molding-profile 306 intersect and exceed the substrate-material profile 304 at a temperature greater than the transition temperature 308 can cause smiling warpage. The warpage can occur because of the molding 112 shrink more than the substrate 104 as the molding 112 cools below the transition temperature 308.

The temperature profile 302 can further show profiles materials that can be selected as the coupling encapsulation 114 of FIG. 1. For example, the temperature profile 302 can show an expanding profile 310 of one candidate encapsulation material and an shrinking profile 312 of another candidate encapsulation material. The temperature profile 302 can also show a selected transition level 314.

The selected transition level 314 is defined a temperature level or a range of temperature levels for determining the physical characteristic of a candidate encapsulation material to be selected as the coupling encapsulation 114. The coupled characteristic 117 of FIG. 1 can include the selected transition level 314. The selected transition level 314 can be the temperature level required to achieve a threshold level of viscosity defining glass-liquid transition for candidate encapsulation material to be selected as the coupling encapsulation 114.

For illustrative purposes, the temperature profile 302 is shown as representing two candidate encapsulation materials having the same value for the selected transition level 314. However, it is understood that the temperature profile 302 can show any number of candidate encapsulation materials each having unique value for the selected transition level 314.

The expanding profile 310 is defined as a characterization of an encapsulation material that can cause a crying warpage type of effect on the combination of the molding 112 and the substrate 104. The encapsulation material having the expanding profile 310 can be selected as the coupling encapsulation 114 to correct and maintain planar configuration of the combination of the molding 112 and the substrate 104 when the combination is observed to have a smiling warpage.

The expanding profile 310 can have specific characteristics relative to the substrate-material profile 304, the molding-profile 306, the transition temperature 308, the selected transition level 314, or a combination thereof. For example, the expanding profile 310 can be greater than the substrate-material profile 304, the molding-profile 306, or a combination thereof.

Also for example, the expanding profile 310 can have a greater slope than the substrate-material profile 304, the molding-profile 306, or a combination thereof or intersect. For further example, the expanding profile 310 can exceed the substrate-material profile 304 at a higher temperature than the transition temperature 308 for a material having the selected transition level 314 greater than the transition temperature 308.

It has been discovered that the coupling encapsulation 114 having the expanding profile 310 provides warpage correction and prevention, specifically for correcting and preventing smiling warpage in the in the integrated circuit packaging system 100. The expanding profile 310 having values greater than the molding-profile 306 and the substrate-material profile 304 around the selected transition level 314 of the coupling encapsulation 114 can be used to correct the warpage in the combination of the molding 112 and the substrate 104. The coupling encapsulation 114 having the expanding profile 310 can thus prevent the warpage in the integrated circuit packaging system 100.

The shrinking profile 312 is defined as a characterization of a different encapsulation material that can cause a smiling warpage type of effect on the combination of the molding 112 and the substrate 104. The different encapsulation material having the shrinking profile 312 can be selected as the coupling encapsulation 114 to correct and maintain planar configuration of the combination of the molding 112 and the substrate 104 when the combination is observed to have a crying warpage.

The shrinking profile 312 can have specific characteristics relative to the substrate-material profile 304, the molding-profile 306, the transition temperature 308, the selected transition level 314, or a combination thereof. For example, the shrinking profile 312 can be less than the substrate-material profile 304, the molding-profile 306, or a combination thereof.

Also for example, the shrinking profile 312 can have a lesser or slightly greater slope than the substrate-material profile 304, the molding-profile 306, or a combination thereof or intersect. For further example, the shrinking profile 312 can be less than the substrate-material profile 304 near the transition temperature 308 of the different encapsulation material.

It has been discovered that the coupling encapsulation 114 having the shrinking profile 312 provides warpage correction and prevention, specifically preventing and correcting crying warpage in the integrated circuit packaging system 100. The shrinking profile 312 having values lesser than the molding-profile 306 and the substrate-material profile 304 around the selected transition level 314 of the coupling encapsulation 114 can be used to correct the warpage in the combination of the molding 112 and the substrate 104. The coupling encapsulation 114 having the shrinking profile 312 can thus prevent the warpage in the integrated circuit packaging system 100.

The temperature profile 302 can further show crossing positions 316. The crossing positions 316 are locations on the temperature profile 302 having the substrate-material profile 304 intersect the molding-profile 306, the shrinking profile 312, the expanding profile 310, or a combination thereof. The crossing positions 316 can represent situations where the corresponding structures maintain planar shapes.

The crossing positions 316 can be used to identify conditions where warpage may not occur or where particular materials may not be able to correct or prevent any warpage. For example, the instance of the crossing positions 316 between the molding-profile 306 and the substrate-material profile 304 can represent conditions where the combination of the substrate 104 and the molding 112 maintain planar shapes and do not have any warpage.

Also, for example, instance of the crossing positions 316 between the expanding profile 310 or the shrinking profile 312 of the coupling encapsulation 114 can represent conditions where the coupling encapsulation 114 maintains the given shape. In such situations, the coupling encapsulation 114 may not be able to correct or prevent any warpage in the integrated circuit packaging system 100.

Figure 4:
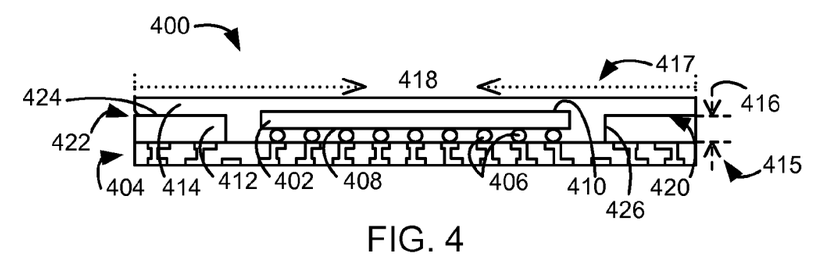
FIG. 4 is a cross-sectional view of an integrated circuit packaging system exemplified by the top view of FIG. 2 along a line 1-1 of FIG. 2 in a second embodiment of the present invention.

Referring now to FIG. 4, therein is shown a cross-sectional view of an integrated circuit packaging system 400 exemplified by the top view of FIG. 2 along a line 1-1 of FIG. 2 in a second embodiment of the present invention. The integrated circuit packaging system 400 can have an integrated circuit die 402, a substrate 404, and an internal interconnect 406.

The integrated circuit die 402, such as a flip chip or a wire bond die, can be mounted over the substrate 404. The substrate 404, such as a printed circuit board or a ceramic based structure, can include various portions. For example, the substrate 404 can have a non-conductive portion, such as an inner support layer or a pre-impregnated layer, or a conductive portion, such as a via, a trace, a pad, or a combination thereof. Also, for example, the substrate 404 can include multiple layers, such as involving a support layer, a solder resist layer, a metal layer, a dielectric layer, or a combination thereof.

The integrated circuit die 402 can have an active side 408 and a passive side 410. The active side 408 is defined as the surface having a structure for electrically connecting the integrated circuit die 402. For example, the active side 408 can be the side having pads or bumps for connecting the integrated circuit die 402 to other components or structures. The active side 408 can be the active surface of the integrated circuit die 402. The passive side 410 can be a surface of the integrated circuit die 402 opposite to the active side 408.

The integrated circuit die 402 can be connected to the substrate 404 through the internal interconnect 406, such as a bond wire or a solder bump. The internal interconnect 406 can be conductive and can be used to relay electrical signal, power, ground, or reference potential between the integrated circuit die 402 and the conductive portion of the substrate 404.

The integrated circuit packaging system 400 can have a molding 412 and a coupling encapsulation 414. The molding 412 is defined as an epoxy material for protecting the integrated circuit packaging system 400. The molding 412 can be over and directly on the substrate 404.

The coupling encapsulation 414 is defined as an epoxy material having different chemical composition or physical properties than the molding 412. For example, the coupling encapsulation 414 can have different chemical bonding or lattice arrangement or have different temperature-viscosity profile than the molding 412.

The coupling encapsulation 414 can be over the integrated circuit die 402, the substrate 404, the internal interconnect 406, the molding 412, or a combination thereof. The coupling encapsulation 414 can be can be directly on the integrated circuit die 402 or a top portion thereof, the molding 412, or a combination thereof.

The molding 412 and the coupling encapsulation 414 can be different in various ways. For example, the two structures can have different density, chemical composition, or a combination thereof.

The molding 412 can have a temperature-dependent characteristic 415. The temperature-dependent characteristic 415 is defined as a physical attribute, a characteristic, or a combination thereof that changes based on temperature. For example, the temperature-dependent characteristic 415 can include changes in size based on coefficient of thermal expansion (CTE), viscosity levels, arrangement of lattice structures, or a combination thereof.

The temperature-dependent characteristic 415 can include a base shrinkage 416. The base shrinkage 416 is defined as a representation of change in size of the molding 412 in response to temperature change. The base shrinkage 416 can be a percentage, a size measurement, a rate of change in size corresponding to temperature or a change in temperature, a range of values thereof, or a combination thereof.

For example, the base shrinkage 416 can be a percentage decrease in horizontal dimension, vertical dimension, or a combination thereof when the molding 412 goes from 450 degrees to 400 degrees Fahrenheit or with 40 degree Celsius change in an average temperature of the molding 412. Also, for example, the base shrinkage 416 can be a profile of the volume of the molding 412 at various temperatures.

The base shrinkage 416 can be the size and behavior, such as shrinking or expanding, of the molding 412 during manufacturing. For example, the base shrinkage 416 can be the change in size of the molding 412 corresponding to temperatures experienced during processes such as flowing, curing, solder reflow, or a combination thereof.

The base shrinkage 416 can affect the shape of the integrated circuit packaging device 400 due to mismatches in the CTE of various structures and components therein. The mismatches in the CTE can have the base shrinkage 416 cause the integrated circuit packaging device 400 to warp. For example, the substrate 404 can change from planar shape to a concave or convex shape.

The integrated circuit packaging device 400 can have the coupling encapsulation 414 selected to maintain the planar shape of the substrate 404 and prevent warpage in the integrated circuit packaging device 400. The coupling encapsulation 414 having different physical characteristics than the molding 412 can be selected. The differences in physical characteristics can counteract the effects of the molding 412 and the coupling encapsulation 414 to maintain the planar shape of the substrate 404 and prevent warpage in the integrated circuit packaging device 400.

The coupling encapsulation 414 can have a coupled characteristic 417. The coupled characteristic 417 is defined as physical attribute, a characteristic, or a combination thereof that changes based on temperature. For example, the coupled characteristic 417 can include changes in size based on coefficient of thermal expansion (CTE), viscosity levels, arrangement of lattice structures, or a combination thereof.

The coupled characteristic 417 can include a coupled shrinkage 418. The coupled shrinkage 418 defined as a representation of change in size of the coupling encapsulation 414 in response to temperature change. The coupled shrinkage 418 can be a percentage, a size measurement, a rate of change in size corresponding to temperature or a change in temperature, a range of values thereof, or a combination thereof.

For example, the coupled shrinkage 418 can be a percentage decrease in horizontal dimension, vertical dimension, or a combination thereof when the coupling encapsulation 414 goes from 450 degrees to 400 degrees Fahrenheit or with 40 degree Celsius change in an average temperature of the coupling encapsulation 414. Also, for example, the coupled shrinkage 418 can be a profile of the volume of the coupling encapsulation 414 various temperatures.

The coupled characteristic 417 can be the same type of characteristic as the temperature-dependent characteristic 415 but have different magnitude or value. For example, the coupled shrinkage 418 can be of a greater or lesser value or rate than the base shrinkage 416. Also, for example, the coupled shrinkage 418 can have a different profile than the base shrinkage 416. For further example, the coupled characteristic 417 and the temperature-dependent characteristic 415 include glass transition temperatures of the molding 412 and the coupling encapsulation 414 that transition at different temperatures.

For illustrative purposes, the base shrinkage 416 is shown along a vertical direction and the coupled shrinkage 418 is shown along a horizontal direction. However, it is understood that the shrinkage can occur along the horizontal direction, the vertical direction, or a combination thereof for the molding 412, the coupling encapsulation 414, or a combination thereof.

Also, for illustrative purposes, the sizes of the arrows representing the base shrinkage 416 is shown as being smaller than those of the coupled shrinkage 418 to represent different rates of shrinkage. However, it is understood that the coupled shrinkage 418 can be greater than, equal to, or lesser than the base shrinkage 416.

The integrated circuit packaging system 400 can have the base shrinkage 416 of the molding 412 and the coupled shrinkage 418 of the coupling encapsulation 414 selected to prevent warpage during manufacturing. The base shrinkage 416 and the coupled shrinkage 418 can be selected to prevent or correct warpage during manufacturing of the integrated circuit packaging system 400.

For example, the molding 412 can have 0.2-0.4% for the base shrinkage 416 between flowing and curing and cause a convex or "crying" warpage in the molding 412, the substrate 404, or a combination thereof. The coupling encapsulation 414 having the coupled shrinkage 418 of 0.7-1.0% between flowing and curing can be selected and formed directly on the molding 412. The coupled shrinkage 418 can be selected to reinstate planar horizontal surface for the molding 412, the substrate 404, or a combination thereof and correct the warpage caused in forming the molding 412.

Also, for example, the molding 412 can have the base shrinkage 416 between operational temperature range and ambient temperature range that can cause a concave or "smiling" warpage in the integrated circuit packaging system 400. The coupling encapsulation 414 can be selected to have the coupled shrinkage 418 to counteract the forces caused by change in dimensions for the molding 412.

It has been discovered that the temperature-dependent characteristic 415 and the coupled characteristic 417, including the base shrinkage 416 and the coupled shrinkage 418, can be selected to provide improved warpage control while maintaining low manufacturing cost. The temperature-dependent characteristic 415 and the coupled characteristic 417 can be selected to have the molding 412 and the coupling encapsulation 414 counteract the effects of shrinkage caused by each other. The interaction between the two structures can further eliminate the need for additional stiffening or stress relieving structures in preventing warpage.

The integrated circuit packaging system 400 can have an encapsulation boundary 420, an irregular surface portion 422, or a combination thereof. The encapsulation boundary 420 is defined as a surface or surfaces directly on each other between the molding 412 and the coupling encapsulation 414. The encapsulation boundary can be planar or non-planar.

The encapsulation boundary 420 can be the surface resulting from a surface of the molding 412 directly on a coupling surface of the coupling encapsulation 414. The encapsulation boundary 420 can be a result or characteristic of forming the molding 412 and the coupling encapsulation 414 separately. The encapsulation boundary 420 can also be a result or characteristic of the differences in densities, chemical compositions, shrinkage rates, or a combination thereof between the molding 412 and the coupling encapsulation 414.

The encapsulation boundary 420 can extend in a non-horizontal direction, a non-vertical direction, or a combination thereof. The encapsulation boundary 420 can be located between the active side 408 and the passive side 410 and can be directly on a periphery non-horizontal surface of the integrated circuit die 402. The encapsulation boundary 420 can also be located above, below, or coplanar with the active side 408 or the passive side 410.

For example, the molding 412 can be formed having a shape of a strip having a uniform width and thickness directly on a perimeter portion of the substrate 404. The molding 412 can have a non-vertical surface on a top portion of the molding 412 integral with a non-horizontal surface extending between the non-vertical surface and a top surface of the substrate 404. The non-horizontal surface can be located between a periphery edge of the substrate 404 and a periphery edge of the integrated circuit die 402 along a horizontal direction, without overlapping the integrated circuit die 402.

Continuing with the example, the coupling encapsulation 414 can be directly on the molding 412 to form the encapsulation boundary 420 between the molding 412 and the coupling encapsulation 414. The encapsulation boundary 420 can have a non-vertical surface 424 extending horizontally inward from a perimeter portion of the integrate circuit system 400. The non-vertical surface 424 can be located between the active side 408 and the passive side 410 along a vertical direction. The non-vertical surface 424 can be integral with a non-horizontal surface 426 located between the periphery edge of the substrate 404 and the periphery edge of the integrated circuit die 402 along the horizontal direction.

It has been discovered that the encapsulation boundary 420, as a characteristic or result of differences in characteristics between the molding 412 and the coupling encapsulation 414, provide improved warpage control while maintaining low manufacturing cost. The encapsulation boundary 420 can provide a scheme for utilizing the difference in characteristics between the molding 412 and the coupling encapsulation 414 to counteract each other to prevent warpage.

It has been further discovered that the encapsulation boundary 420 having the non-vertical surface 424 and the non-horizontal surface 426 provide granularity for controlling the amount of warpage without increasing the manufacturing cost or complexity. The non-vertical surface 424 and the non-horizontal surface 426 can be used to control the amount and location of the contact between the molding 412 and the coupling encapsulation 414. The non-vertical surface 424 and the non-horizontal surface 426 can also be used to control the volume, density, or a combination thereof for different portions of the integrated circuit packaging system 400.

The irregular surface portion 422 is defined as a non-planar portion of a surface, such as an indentation or a protrusion. The irregular surface portion 422 can be located abutting or at the encapsulation boundary 420. The irregular surface portion 422 can have a surface or surfaces integral with the encapsulation boundary 420.

For example, the irregular surface portion 422 can be an indentation, a protrusion, or a combination thereof, on a non-horizontal surface along a periphery portion of the integrated circuit packaging system 400. The irregular surface portion 422 can be located where the molding 412 is directly on the coupling encapsulation 414 along the non-horizontal surface.

The irregular surface portion 422 can be a result or characteristic of forming the molding 412 and the coupling encapsulation 414 separately. The irregular surface portion 422 can also be a result or characteristic of the differences in densities, chemical compositions, the base shrinkage 416 and the coupled shrinkage 418, or a combination thereof between the molding 412 and the coupling encapsulation 414.

It has been discovered that the irregular surface portion 422, as a characteristic or result of differences in characteristics between the molding 412 and the coupling encapsulation 414 provide improved warpage control while maintaining low manufacturing cost. The difference in characteristics between the molding 412 and the coupling encapsulation 414 causing the irregular surface portion 422 can counteract each other to prevent warpage.

The molding 412 can have the temperature-dependent characteristic 415 that includes the transition temperature 308 of FIG. 3. The coupling encapsulation 414 can have the coupled characteristic 417 that includes the selected transition level 314 of FIG. 3.

It has been discovered that the transition temperature 308 and the selected transition level 314 can be selected to provide improved warpage control while maintaining low manufacturing cost. The transition temperature 308 and the selected transition level 314 can be selected to have the molding 412 and the coupling encapsulation 414 counteract the effects of shrinkage caused by each other. The transition temperature 308 and the selected transition level 314 can be selected to reinforce the overall structure or to take advantage of the softening of the materials at different temperatures.

It has also been discovered that the coupling encapsulation 414 having the selected transition level 314, the coupled shrinkage 418, or a combination thereof different from the transition temperature 308, the base shrinkage 416, or a combination thereof provide improved yield rate and simpler manufacturing process. The coupling encapsulation 414 having the desired amount of mismatch from the properties of the molding 412 can be selected and directly applied on the molding 412 to correct, to prevent, or to do both concerning warpage.

Figure 5:
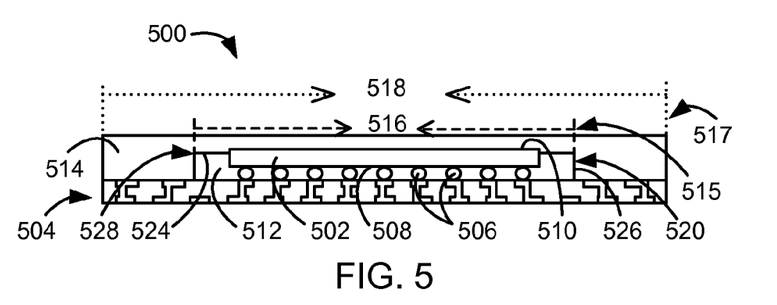
FIG. 5 is a cross-sectional view of an integrated circuit packaging system exemplified by the top view of FIG. 2 along a line 1-1 of FIG. 2 in a third embodiment of the present invention.

Referring now to FIG. 5, therein is shown a cross-sectional view of an integrated circuit packaging system 500 exemplified by the top view of FIG. 2 along a line 1-1 of FIG. 2 in a third embodiment of the present invention. The integrated circuit packaging system 500 can have an integrated circuit die 502, a substrate 504, and an internal interconnect 506.

The integrated circuit die 502, such as a flip chip or a wire bond die, can be mounted over the substrate 504. The substrate 504, such as a printed circuit board or a ceramic based structure, can include various portions. For example, the substrate 504 can have a non-conductive portion, such as an inner support layer or a pre-impregnated layer, or a conductive portion, such as a via, a trace, a pad, or a combination thereof. Also, for example, the substrate 504 can include multiple layers, such as involving a support layer, a solder resist layer, a metal layer, a dielectric layer, or a combination thereof.

The integrated circuit die 502 can have an active side 508 and a passive side 510. The active side 508 is defined as the surface having a structure for electrically connecting the integrated circuit die 502. For example, the active side 508 can be the side having pads or bumps for connecting the integrated circuit die 502 to other components or structures. The active side 508 can be the active surface of the integrated circuit die 502. The passive side 510 can be a surface of the integrated circuit die 502 opposite to the active side 508.

The integrated circuit die 502 can be connected to the substrate 504 through the internal interconnect 506, such as a bond wire or a solder bump. The internal interconnect 506 can be conductive and can be used to relay electrical signal, power, ground, or reference potential between the integrated circuit die 502 and the conductive portion of the substrate 504.

The integrated circuit packaging system 500 can have a molding 512 and a coupling encapsulation 514. The molding 512 is defined as an epoxy material for protecting the integrated circuit packaging system 500. The molding 512 can be over the integrated circuit die 502, the substrate 504, the internal interconnect 506, or a combination thereof. The molding 512 can be directly on the substrate 504, the internal interconnect 506, the integrated circuit die 502 or a bottom portion thereof, or a combination thereof.

The coupling encapsulation 514 is defined as an epoxy material having different chemical composition or physical properties than the molding 512. For example, the coupling encapsulation 514 can have different chemical bonding or lattice arrangement or have different temperature-viscosity profile than the molding 512.

The coupling encapsulation 514 can be over the integrated circuit die 502, the substrate 504, the internal interconnect 506, the molding 512, or a combination thereof. The coupling encapsulation 514 can be can be directly on the integrated circuit die 502 or a top portion thereof, the molding 512, or a combination thereof.

The molding 512 and the coupling encapsulation 514 can be different in various ways. For example, the two structures can have different density, chemical composition, or a combination thereof.

The molding 512 can have a temperature-dependent characteristic 515. The temperature-dependent characteristic 515 is defined as a physical attribute, a characteristic, or a combination thereof that changes based on temperature. For example, the temperature-dependent characteristic 515 can include changes in size based on coefficient of thermal expansion (CTE), viscosity levels, arrangement of lattice structures, or a combination thereof.

The temperature-dependent characteristic 515 can include a base shrinkage 516. The base shrinkage 516 is defined as a representation of change in size of the molding 512 in response to temperature change. The base shrinkage 516 can be a percentage, a size measurement, a rate of change in size corresponding to temperature or a change in temperature, a range of values thereof, or a combination thereof.

For example, the base shrinkage 516 can be a percentage decrease in horizontal dimension, vertical dimension, or a combination thereof when the molding 512 goes from 550 degrees to 500 degrees Fahrenheit or with 50 degree Celsius change in an average temperature of the molding 512. Also, for example, the base shrinkage 516 can be a profile of the volume of the molding 512 at various temperatures.

The base shrinkage 516 can be the size and behavior, such as shrinking or expanding, of the molding 512 during manufacturing. For example, the base shrinkage 516 can be the change in size of the molding 512 corresponding to temperatures experienced during processes such as flowing, curing, solder reflow, or a combination thereof.

The base shrinkage 516 can affect the shape of the integrated circuit packaging device 500 due to mismatches in the CTE of various structures and components therein. The mismatches in the CTE can have the base shrinkage 516 cause the integrated circuit packaging device 500 to warp. For example, the substrate 504 can change from planar shape to a concave or convex shape.

The integrated circuit packaging device 500 can have the coupling encapsulation 514 selected to maintain the planar shape of the substrate 504 and prevent warpage in the integrated circuit packaging device 500. The coupling encapsulation 514 having different physical characteristics than the molding 512 can be selected. The differences in physical characteristics can counteract the effects of the molding 512 and the coupling encapsulation 514 to maintain the planar shape of the substrate 504 and prevent warpage in the integrated circuit packaging device 500.

The coupling encapsulation 514 can have a coupled characteristic 517. The coupled characteristic 517 is defined as physical attribute, a characteristic, or a combination thereof that changes based on temperature. For example, the coupled characteristic 517 can include changes in size based on coefficient of thermal expansion (CTE), viscosity levels, arrangement of lattice structures, or a combination thereof.

The coupled characteristic 517 can include a coupled shrinkage 518. The coupled shrinkage 518 defined as a representation of change in size of the coupling encapsulation 514 in response to temperature change. The coupled shrinkage 518 can be a percentage, a size measurement, a rate of change in size corresponding to temperature or a change in temperature, a range of values thereof, or a combination thereof.

For example, the coupled shrinkage 518 can be a percentage decrease in horizontal dimension, vertical dimension, or a combination thereof when the coupling encapsulation 514 goes from 550 degrees to 500 degrees Fahrenheit or with 50 degree Celsius change in an average temperature of the coupling encapsulation 514. Also, for example, the coupled shrinkage 518 can be a profile of the volume of the coupling encapsulation 514 various temperatures.

The coupled characteristic 517 can be the same type of characteristic as the temperature-dependent characteristic 515 but have different magnitude or value. For example, the coupled shrinkage 518 can be of a greater or lesser value or rate than the base shrinkage 516. Also, for example, the coupled shrinkage 518 can have a different profile than the base shrinkage 516. For further example, the coupled characteristic 517 and the temperature-dependent characteristic 515 include glass transition temperatures of the molding 512 and the coupling encapsulation 514 that transition at different temperatures.

For illustrative purposes, the base shrinkage 516 and the coupled shrinkage 518 are shown along a horizontal direction. However, it is understood that the shrinkage can occur along the horizontal direction, the vertical direction, or a combination thereof for the molding 512, the coupling encapsulation 514, or a combination thereof.

Also, for illustrative purposes, the sizes of the arrows representing the base shrinkage 516 is shown as being smaller than those of the coupled shrinkage 518 to represent different rates of shrinkage. However, it is understood that the coupled shrinkage 518 can be greater than, equal to, or lesser than the base shrinkage 516.

The integrated circuit packaging system 500 can have the base shrinkage 516 of the molding 512 and the coupled shrinkage 518 of the coupling encapsulation 514 selected to prevent warpage during manufacturing. The base shrinkage 516 and the coupled shrinkage 518 can be selected to prevent or correct warpage during manufacturing of the integrated circuit packaging system 500.

For example, the molding 512 can have 0.2-0.4% for the base shrinkage 516 between flowing and curing and cause a convex or "crying" warpage in the molding 512, the substrate 504, or a combination thereof. The coupling encapsulation 514 having the coupled shrinkage 518 of 0.7-1.0% between flowing and curing can be selected and formed directly on the molding 512. The coupled shrinkage 518 can be selected to reinstate planar horizontal surface for the molding 512, the substrate 504, or a combination thereof and correct the warpage caused in forming the molding 512.

Also, for example, the molding 512 can have the base shrinkage 516 between operational temperature range and ambient temperature range that can cause a concave or "smiling" warpage in the integrated circuit packaging system 500. The coupling encapsulation 514 can be selected to have the coupled shrinkage 518 to counteract the forces caused by change in dimensions for the molding 512.

It has been discovered that the temperature-dependent characteristic 515 and the coupled characteristic 517, including the base shrinkage 516 and the coupled shrinkage 518, can be selected to provide improved warpage control while maintaining low manufacturing cost. The temperature-dependent characteristic 515 and the coupled characteristic 517 can be selected to have the molding 512 and the coupling encapsulation 514 counteract the effects of shrinkage caused by each other. The interaction between the two structures can further eliminate the need for additional stiffening or stress relieving structures in preventing warpage.

The integrated circuit packaging system 500 can have an encapsulation boundary 520. The encapsulation boundary 520 is defined as a surface or surfaces directly on each other between the molding 512 and the coupling encapsulation 514. The encapsulation boundary can be planar or non-planar.

The encapsulation boundary 520 can be the surface resulting from a surface of the molding 512 directly on a coupling surface of the coupling encapsulation 514. The encapsulation boundary 520 can be a result or characteristic of forming the molding 512 and the coupling encapsulation 514 separately. The encapsulation boundary 520 can also be a result or characteristic of the differences in densities, chemical compositions, shrinkage rates, or a combination thereof between the molding 512 and the coupling encapsulation 514.

The encapsulation boundary 520 can extend in a non-horizontal direction, a non-vertical direction, or a combination thereof. The encapsulation boundary 520 can be located between the active side 508 and the passive side 510 and can be directly on a periphery non-horizontal surface of the integrated circuit die 502. The encapsulation boundary 520 can also be located above, below, or coplanar with the active side 508 or the passive side 510.

For example, the molding 512 can be formed having a shape of a strip having a uniform width and thickness directly on a perimeter portion of the substrate 504. The molding 512 can have a non-vertical surface on a top portion of the molding 512 integral with a non-horizontal surface extending between the non-vertical surface and a top surface of the substrate 504. The non-horizontal surface can be located between a periphery edge of the substrate 504 and a periphery edge of the integrated circuit die 502 along a horizontal direction, without overlapping the integrated circuit die 502.

Continuing with the example, the coupling encapsulation 514 can be directly on the molding 512 to form the encapsulation boundary 520 between the molding 512 and the coupling encapsulation 514. The encapsulation boundary 520 can have a non-vertical surface 524 extending horizontally toward a perimeter portion of the integrate circuit system 500 from a periphery surface of the integrated circuit die 502.

Continuing with the example, the non-vertical surface 524 can be located between the active side 508 and the passive side 510. The non-vertical surface 524 can be integral with a non-horizontal surface 526 located between the periphery edge of the substrate 504 and the periphery edge of the integrated circuit die 502 along the horizontal direction.

It has been discovered that the encapsulation boundary 520, as a characteristic or result of differences in characteristics between the molding 512 and the coupling encapsulation 514, provide improved warpage control while maintaining low manufacturing cost. The encapsulation boundary 520 can provide a scheme for utilizing the difference in characteristics between the molding 512 and the coupling encapsulation 514 to counteract each other to prevent warpage.

It has been further discovered that the encapsulation boundary 520 having the non-vertical surface 524 and the non-horizontal surface 526 provide granularity for controlling the amount of warpage without increasing the manufacturing cost or complexity. The non-vertical surface 524 and the non-horizontal surface 526 can be used to control the amount and location of the contact between the molding 512 and the coupling encapsulation 514. The non-vertical surface 524 and the non-horizontal surface 526 can also be used to control the volume, density, or a combination thereof for different portions of the integrated circuit packaging system 500.

Continuing with the example, the encapsulation boundary 520 can have a protruding corner 528. The non-vertical surface 524 and the non-horizontal surface 526 can form the protruding corner 528. The non-vertical surface 524 and the non-horizontal surface 526 can join at an angle, such as acute, right, or obtuse angle, or join to form a convex surface to form the protruding corner 528.

Continuing with the example, the protruding corner 528 can be a result or a characteristic of forming the molding 512 using a mold chase and further forming the coupling encapsulation 514 directly on the molding 512. The protruding corner 528 can be distinguishable from packages having a type of under-fill instead of the molding 512.

It has been discovered that the encapsulation boundary 520 having the protruding corner 528 increase bonding strength between the molding 512 and the coupling encapsulation 514. It has also been discovered that the encapsulation boundary 520 having the protruding corner 528 provide efficiency in controlling warpage. The protruding corner 528 can maximize the direct contact between the molding 512 and the coupling encapsulation 514 and provide a mold-lock type of mechanism between the structures. The increased bond strength and lock between the structures can further assist in transferring the offsetting forces between structures.

The molding 512 can have the temperature-dependent characteristic 515 that includes the transition temperature 308 of FIG. 3. The coupling encapsulation 514 can have the coupled characteristic 517 that includes the selected transition level 314 of FIG. 3.

It has been discovered that the transition temperature 308 and the selected transition level 314 can be selected to provide improved warpage control while maintaining low manufacturing cost. The transition temperature 308 and the selected transition level 314 can be selected to have the molding 512 and the coupling encapsulation 514 counteract the effects of shrinkage caused by each other. The transition temperature 308 and the selected transition level 314 can be selected to reinforce the overall structure or to take advantage of the softening of the materials at different temperatures.

It has also been discovered that the coupling encapsulation 514 having the selected transition level 314, the coupled shrinkage 518, or a combination thereof different from the transition temperature 308, the base shrinkage 516, or a combination thereof provide improved yield rate and simpler manufacturing process. The coupling encapsulation 514 having the desired amount of mismatch from the properties of the molding 512 can be selected and directly applied on the molding 512 to correct, to prevent, or to do both concerning warpage.

Figure 6:
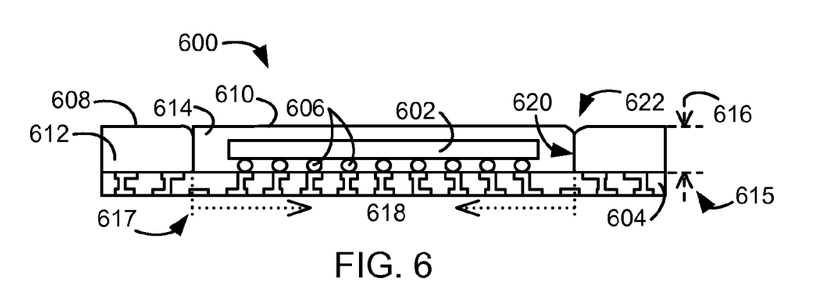
FIG. 6 is a cross-sectional view of an integrated circuit packaging system along a line 6-6 of FIG. 7 in a fourth embodiment of the present invention.
Figure 7:
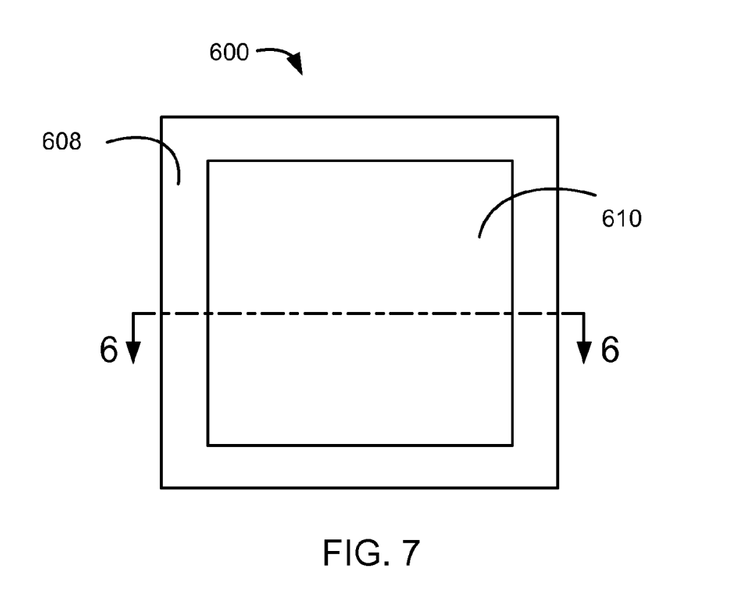
FIG. 7 is a top view of the integrated circuit packaging system in the fourth embodiment of the present invention.

Referring now to FIG. 6, therein is shown a cross-sectional view of an integrated circuit packaging system 600 along a line 6-6 of FIG. 7 in a fourth embodiment of the present invention. The integrated circuit packaging system 600 can have an integrated circuit die 602, a substrate 604, and an internal interconnect 606.

The integrated circuit die 602, such as a flip chip or a wire bond die, can be mounted over the substrate 604. The substrate 604, such as a printed circuit board or a ceramic based structure, can include various portions. For example, the substrate 604 can have a non-conductive portion, such as an inner support layer or a pre-impregnated layer, or a conductive portion, such as a via, a trace, a pad, or a combination thereof. Also, for example, the substrate 604 can include multiple layers, such as involving a support layer, a solder resist layer, a metal layer, a dielectric layer, or a combination thereof.

The integrated circuit die 602 can be connected to the substrate 604 through the internal interconnect 606, such as a bond wire or a solder bump. The internal interconnect 606 can be conductive and can be used to relay electrical signal, power, ground, or reference potential between the integrated circuit die 602 and the conductive portion of the substrate 604.

The integrated circuit packaging system 600 can have a molding 612 and a coupling encapsulation 614. The molding 612 is defined as an epoxy material for protecting the integrated circuit packaging system 600. The molding 612 can be directly on the substrate 604. The molding 612 can have a primary top surface 608. The primary top surface 608 can be above the integrated circuit die 602. The primary top surface 608 can also be planar.

The coupling encapsulation 614 is defined as an epoxy material having different chemical composition or physical properties than the molding 612. For example, the coupling encapsulation 614 can have different chemical bonding or lattice arrangement or have different temperature-viscosity profile than the molding 612.

The coupling encapsulation 614 can be over the integrated circuit die 602, the substrate 604, the internal interconnect 606, the molding 612, or a combination thereof. The coupling encapsulation 614 can be can be directly on the integrated circuit die 602 or a top portion thereof, the molding 612, or a combination thereof.

The coupling encapsulation 614 can have a coupling top surface 610. The coupling top surface 610 can be above the integrated circuit die 602. The coupling top surface 610 can be planar. The coupling top surface 610 can be coplanar with the primary top surface 608.

The molding 612 and the coupling encapsulation 614 can be different in various ways. For example, the two structures can have different density, chemical composition, or a combination thereof.

The molding 612 can have a temperature-dependent characteristic 615. The temperature-dependent characteristic 615 is defined as a physical attribute, a characteristic, or a combination thereof that changes based on temperature. For example, the temperature-dependent characteristic 615 can include changes in size based on coefficient of thermal expansion (CTE), viscosity levels, arrangement of lattice structures, or a combination thereof.

The temperature-dependent characteristic 615 can include a base shrinkage 616. The base shrinkage 616 is defined as a representation of change in size of the molding 612 in response to temperature change. The base shrinkage 616 can be a percentage, a size measurement, a rate of change in size corresponding to temperature or a change in temperature, a range of values thereof, or a combination thereof.

For example, the base shrinkage 616 can be a percentage decrease in horizontal dimension, vertical dimension, or a combination thereof when the molding 612 goes from 650 degrees to 600 degrees Fahrenheit or with 60 degree Celsius change in an average temperature of the molding 612. Also, for example, the base shrinkage 616 can be a profile of the volume of the molding 612 at various temperatures.

The base shrinkage 616 can be the size and behavior, such as shrinking or expanding, of the molding 612 during manufacturing. For example, the base shrinkage 616 can be the change in size of the molding 612 corresponding to temperatures experienced during processes such as flowing, curing, solder reflow, or a combination thereof.

The base shrinkage 616 can affect the shape of the integrated circuit packaging device 600 due to mismatches in the CTE of various structures and components therein. The mismatches in the CTE can have the base shrinkage 616 cause the integrated circuit packaging device 600 to warp. For example, the substrate 604 can change from planar shape to a concave or convex shape.

The integrated circuit packaging device 600 can have the coupling encapsulation 614 selected to maintain the planar shape of the substrate 604 and prevent warpage in the integrated circuit packaging device 600. The coupling encapsulation 614 having different physical characteristics than the molding 612 can be selected. The differences in physical characteristics can counteract the effects of the molding 612 and the coupling encapsulation 614 to maintain the planar shape of the substrate 604 and prevent warpage in the integrated circuit packaging device 600.

The coupling encapsulation 614 can have a coupled characteristic 617. The coupled characteristic 617 is defined as physical attribute, a characteristic, or a combination thereof that changes based on temperature. For example, the coupled characteristic 617 can include changes in size based on coefficient of thermal expansion (CTE), viscosity levels, arrangement of lattice structures, or a combination thereof.

The coupled characteristic 617 can include a coupled shrinkage 618. The coupled shrinkage 618 defined as a representation of change in size of the coupling encapsulation 614 in response to temperature change. The coupled shrinkage 618 can be a percentage, a size measurement, a rate of change in size corresponding to temperature or a change in temperature, a range of values thereof, or a combination thereof.

For example, the coupled shrinkage 618 can be a percentage decrease in horizontal dimension, vertical dimension, or a combination thereof when the coupling encapsulation 614 goes from 650 degrees to 600 degrees Fahrenheit or with 60 degree Celsius change in an average temperature of the coupling encapsulation 614. Also, for example, the coupled shrinkage 618 can be a profile of the volume of the coupling encapsulation 614 various temperatures.

The coupled characteristic 617 can be the same type of characteristic as the temperature-dependent characteristic 615 but have different magnitude or value. For example, the coupled shrinkage 618 can be of a greater or lesser value or rate than the base shrinkage 616. Also, for example, the coupled shrinkage 618 can have a different profile than the base shrinkage 616. For further example, the coupled characteristic 617 and the temperature-dependent characteristic 615 include glass transition temperatures of the molding 612 and the coupling encapsulation 614 that transition at different temperatures.

For illustrative purposes, the base shrinkage 616 is shown along a vertical direction and the coupled shrinkage 618 is shown along a horizontal direction. However, it is understood that the shrinkage can occur along the horizontal direction, the vertical direction, or a combination thereof for the molding 612, the coupling encapsulation 614, or a combination thereof.

Also, for illustrative purposes, the sizes of the arrows representing the base shrinkage 616 is shown as being smaller than those of the coupled shrinkage 618 to represent different rates of shrinkage. However, it is understood that the coupled shrinkage 618 can be greater than, equal to, or lesser than the base shrinkage 616.

The integrated circuit packaging system 600 can have the base shrinkage 616 of the molding 612 and the coupled shrinkage 618 of the coupling encapsulation 614 selected to prevent warpage during manufacturing. The base shrinkage 616 and the coupled shrinkage 618 can be selected to prevent or correct warpage during manufacturing of the integrated circuit packaging system 600.

For example, the molding 612 can have 0.2-0.4% for the base shrinkage 616 between flowing and curing and cause a convex or "crying" warpage in the molding 612, the substrate 604, or a combination thereof. The coupling encapsulation 614 having the coupled shrinkage 618 of 0.7-1.0% between flowing and curing can be selected and formed directly on the molding 612. The coupled shrinkage 618 can be selected to reinstate planar horizontal surface for the molding 612, the substrate 604, or a combination thereof and correct the warpage caused in forming the molding 612.

Also, for example, the molding 612 can have the base shrinkage 616 between operational temperature range and ambient temperature range that can cause a concave or "smiling" warpage in the integrated circuit packaging system 600. The coupling encapsulation 614 can be selected to have the coupled shrinkage 618 to counteract the forces caused by change in dimensions for the molding 612.

It has been discovered that the temperature-dependent characteristic 615 and the coupled characteristic 617, including the base shrinkage 616 and the coupled shrinkage 618, can be selected to provide improved warpage control while maintaining low manufacturing cost. The temperature-dependent characteristic 615 and the coupled characteristic 617 can be selected to have the molding 612 and the coupling encapsulation 614 counteract the effects of shrinkage caused by each other. The interaction between the two structures can further eliminate the need for additional stiffening or stress relieving structures in preventing warpage.

The integrated circuit packaging system 600 can have an encapsulation boundary 620, an irregular surface portion 622, or a combination thereof. The encapsulation boundary 620 is defined as a surface or surfaces directly on each other between the molding 612 and the coupling encapsulation 614. The encapsulation boundary can be planar or non-planar.

The encapsulation boundary 620 can be the surface resulting from a surface of the molding 612 directly on a coupling surface of the coupling encapsulation 614. The encapsulation boundary 620 can be a result or characteristic of forming the molding 612 and the coupling encapsulation 614 separately. The encapsulation boundary 620 can also be a result or characteristic of the differences in densities, chemical compositions, shrinkage rates, or a combination thereof between the molding 612 and the coupling encapsulation 614.

The encapsulation boundary 620 can extend in a non-horizontal direction. The encapsulation boundary 620 can be directly on a top portion of the substrate 604. The encapsulation boundary 620 can extend upward and be integral with the primary top surface 608, the coupling top surface 610, or a combination thereof.

For example, the molding 612 can be formed having a shape of a strip having a uniform width and thickness directly on a perimeter portion of the substrate 604. The coupling encapsulation 614 can be directly on the molding 612 to form the encapsulation boundary 620 between the molding 612 and the coupling encapsulation 614. The coupling encapsulation 614 can be formed over a central portion of the substrate 604 and can be directly on the integrated circuit die 602.

It has been discovered that the encapsulation boundary 620, as a characteristic or result of differences in characteristics between the molding 612 and the coupling encapsulation 614, provide improved warpage control while maintaining low manufacturing cost. The encapsulation boundary 620 can provide a scheme for utilizing the difference in characteristics between the molding 612 and the coupling encapsulation 614 to counteract each other to prevent warpage.

It has been further discovered that having the primary top surface 608 coplanar with the coupling top surface 610, with the encapsulation boundary 620 extending in the non-horizontal direction provides lower cost and less complexity during manufacturing. Having the primary top surface 608 coplanar with the coupling top surface 610, with the encapsulation boundary 620 extending in the non-horizontal direction provides simplified method of forming two structures sharing a same dimension, which can simplify the manufacturing step and design process.

The irregular surface portion 622 is defined as a non-planar portion of a surface, such as an indentation or a protrusion. The irregular surface portion 622 can be located abutting or at the encapsulation boundary 620. The irregular surface portion 622 can have a surface or surfaces integral with the encapsulation boundary 620.

For example, the irregular surface portion 622 can be an indentation, a protrusion, or a combination thereof, on a non-horizontal surface along a top portion of the integrated circuit packaging system 600. The irregular surface portion 622 can be located where the molding 612 is directly on the coupling encapsulation 614 along the non-horizontal surface. The irregular surface portion 622 can be integral with the primary top surface 608, the coupling top surface 610, or a combination thereof. The irregular surface portion 622 can be between the primary top surface 608 and the coupling top surface 610.

The irregular surface portion 622 can be a result or characteristic of forming the molding 612 and the coupling encapsulation 614 separately. The irregular surface portion 622 can also be a result or characteristic of the differences in densities, chemical compositions, the base shrinkage 616 and the coupled shrinkage 618, or a combination thereof between the molding 612 and the coupling encapsulation 614.

It has been discovered that the irregular surface portion 622, as a characteristic or result of differences in characteristics between the molding 612 and the coupling encapsulation 614 provide improved warpage control while maintaining low manufacturing cost. The difference in characteristics between the molding 612 and the coupling encapsulation 614 causing the irregular surface portion 622 can counteract each other to prevent warpage.

The molding 612 can have the temperature-dependent characteristic 615 that includes the transition temperature 308 of FIG. 3. The coupling encapsulation 614 can have the coupled characteristic 617 that includes the selected transition level 314 of FIG. 3.

It has been discovered that the transition temperature 308 and the selected transition level 314 can be selected to provide improved warpage control while maintaining low manufacturing cost. The transition temperature 308 and the selected transition level 314 can be selected to have the molding 612 and the coupling encapsulation 614 counteract the effects of shrinkage caused by each other. The transition temperature 308 and the selected transition level 314 can be selected to reinforce the overall structure or to take advantage of the softening of the materials at different temperatures.

It has also been discovered that the coupling encapsulation 614 having the selected transition level 314, the coupled shrinkage 618, or a combination thereof different from the transition temperature 308, the base shrinkage 616, or a combination thereof provide improved yield rate and simpler manufacturing process. The coupling encapsulation 614 having the desired amount of mismatch from the properties of the molding 612 can be selected and directly applied on the molding 612 to correct, to prevent, or to do both concerning warpage.

Referring now to FIG. 7, therein is shown a top view of the integrated circuit packaging system 600 in the fourth embodiment of the present invention. The top view can show the primary top surface 608 having a shape of a rectangular strip surrounding the coupling top surface 610. The primary top surface 608 can be arranged in a shape of a rectangular frame on the perimeter portions of the integrated circuit packaging system 600. The coupling top surface 610 can be in a central portion of the integrated circuit packaging system 600.

The encapsulation boundary 620 of FIG. 6, the irregular surface portion 622 of FIG. 6, or a combination thereof can be between the primary top surface 608 and the coupling top surface 610. The encapsulation boundary 620, the irregular surface portion 622, or a combination thereof can have a shape of a rectangle.

Figure 8:
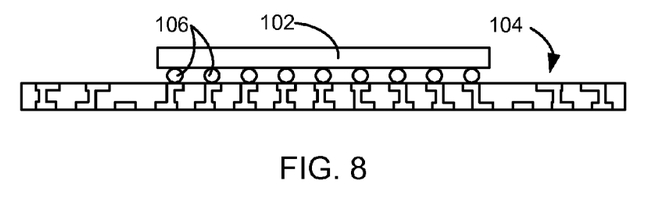
FIG. 8 is an arrangement of the substrate and the integrated circuit die for manufacturing the integrated circuit packaging system of FIG. 1.

Referring now to FIG. 8, therein is shown an arrangement of the substrate 104 and the integrated circuit die 102 for manufacturing the integrated circuit packaging system 100 of FIG. 1. The integrated circuit die 102 can be attached to a top portion of the substrate 104. The integrated circuit die 102 can be electrically connected to a conductive portion of the substrate 104 with the internal interconnect 106.

For example, the integrated circuit die 102 can be a flip chip and the internal interconnect 106 can be a solder bump. The solder bump can be directly on the active side 108 of FIG. 1 of the integrated circuit die 102 with the active side 108 facing the top portion of the substrate 104. The solder bump can also be directly on the conductive portion of the substrate 104 exposed on the top portion thereof.

Also, for example, the integrated circuit die 102 can be a wire bond die and the internal interconnect 106 can be a bond wire. The integrated circuit die 102 can be mounted to the top portion of the substrate 104 with an adhesive structure (not shown). The adhesive structure can be directly on both the passive side 110 of FIG. 1 of the integrated circuit die 102 and the top portion of the substrate 104. The internal interconnect 106 can be directly on both the active side 108 and the conductive portion of the substrate 104 exposed on the top portion thereof.

Figure 9:
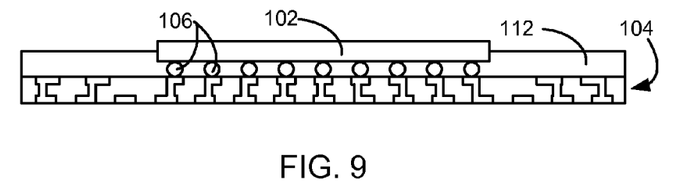
FIG. 9 is the structure of FIG. 8 with the molding formed thereon.

Referring now to FIG. 9, therein is shown the structure of FIG. 8 with the molding 112 formed thereon. The molding 112 can be formed directly on a top portion of the substrate 104, the integrated circuit die 102, the internal interconnect 106, or a combination thereof.

The molding 112 can be formed having an arrangement according to a specified embodiment. For example, the molding 112 can be formed entirely covering a top surface of the substrate 104, only covering a central portion of the substrate 104, or only covering a periphery portion of the substrate 104.

Also, for example, the molding 112 can have a top surface, such as the primary top surface 608 of FIG. 6, above or coplanar with a top surface of the integrated circuit die 102, or below or coplanar with a bottom surface of the integrated circuit die 102. The top surface of the molding 112 can also be between the active side 108 of FIG. 1 and the passive side 110 of FIG. 1.

Figure 10:
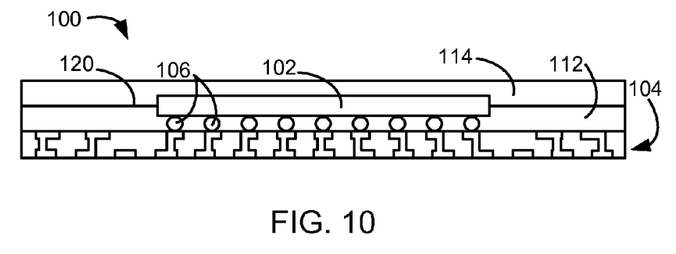
FIG. 10 is the structure of FIG. 9 with the coupling encapsulation formed thereon.

Referring now to FIG. 10, therein is shown the structure of FIG. 9 with the coupling encapsulation 114 formed thereon. The coupling encapsulation 114 can be selected and formed on the molding 112 to correct or prevent warpage in the integrate circuit packaging system 100.

The coupling encapsulation 114 can be selected based on observation of the structure or based on the temperature profile 302 of FIG. 3. For example, the structure can be observed after forming the molding 112 to have a smiling type or a crying type of warpage.

Continuing with the example, the coupling encapsulation 114 having a particular value or a set of values for the selected transition level 314 of FIG. 3 can be selected when the structure has the crying warpage and a different value for the selected transition level 314 when the structure has the smiling warpage. Also, for example, the coupling encapsulation 114 having the expanding profile 310 of FIG. 3 can be selected when the structure has the smiling warpage and the shrinking profile 312 of FIG. 3 when the structure has the crying warpage.

Also, for example, the temperature profile 302 can have the substrate-material profile 304 of FIG. 3 above the molding-profile 306 of FIG. 3 around the transition temperature 308 of FIG. 3. The relationship shown between the substrate 104 and the molding 112 can characterize a smiling warpage for the structure based on the temperature profile 302. The coupling encapsulation 114 having a particular value for the selected transition level 314 and the expanding profile 310 can be selected based on the temperature profile 302 to correct and prevent warpage for the integrate circuit packaging system 100.

The coupling encapsulation 114 can be further selected and formed based on the crossing positions 316 of FIG. 3. For example, when manufacturing conditions match an instance of the crossing positions 316 corresponding to the molding 112, the coupling encapsulation 114 may not be necessary since the structure will likely be planar and without any warpage. Also, for example, the manufacturing conditions can further match a different instance of the crossing positions 316 corresponding to the coupling encapsulation 114 when the structure is planar.

For further example, the manufacturing process can avoid situations represented by the crossing positions 316 when forming the coupling encapsulation 114. The manufacturing process can use the crossing positions 316 as a boundary to maintain the warpage correcting and preventing function in the coupling encapsulation 114.

The coupling encapsulation 114 can be formed directly on the molding 112. The coupling encapsulation 114 can also be directly on the substrate 104, the integrated circuit die 102, the internal interconnect 106, or a combination thereof according to the specified embodiment.

The process of application, curing, forming, or a combination of processes thereof can also form the encapsulation boundary 120 between the molding 112 and the coupling encapsulation 114. The shape of the encapsulation boundary 120 can depend on the shape, location, dimensions, or a combination thereof of the molding 112 according to the specified embodiment.

For example, the encapsulation boundary 120 can be planar and extend in a non-vertical direction from above a perimeter portion of the substrate 104 to over a central portion of the substrate 104. The encapsulation boundary 120 can be above or below the integrated circuit die 102. The encapsulation boundary 120 can also be directly on a periphery surface of the integrated circuit die 102. The encapsulation boundary 120 can also be formed having a portion directly on the substrate 104, have multiple surfaces integral to each other, such as the non-vertical surface 524 of FIG. 5 or the non-horizontal surface 426 of FIG. 4, corner portions, such as the protruding corner 528 of FIG. 5, or a combination thereof.

The process of application, curing, forming, or a combination of processes thereof can further form the irregular surface portion 122 of FIG. 1. The irregular surface portion 122 can be on a surface of the integrated circuit packaging system 100 where the molding 112 is directly on the coupling encapsulation 114.

The irregular surface portion 122 can be formed by a change in dimension for the coupling encapsulation 114 during the application, curing, forming, or a combination thereof for the coupling encapsulation 114. For example, the coupling encapsulation 114 can shrink or expand during an application process, a curing process or a combination thereof. The change in size can create a protrusion, an indentation, a separation, or a combination thereof between the coupling encapsulation 114 and the molding 112.

Figure 11:
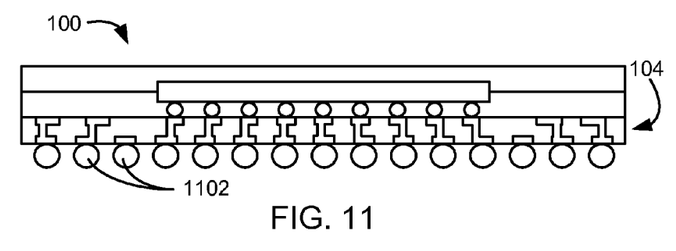
FIG. 11 is the structure of FIG. 10 with an external interconnect formed thereon.

Referring now to FIG. 11, therein is shown the structure of FIG. 10 with an external interconnect 1102 formed thereon. The integrated circuit packaging system 100 can have the external interconnect 1102. The external interconnect 1102 can be a conductive structure for electrically coupling the integrated circuit packaging system 100 to other external structures, such as components or other packages. For example, the external interconnect 1102 can be a solder ball, conductive posts, lands, or a combination thereof. The external interconnect 1102 can be directly on a bottom surface of the conductive portion of the substrate 104.

Figure 12:
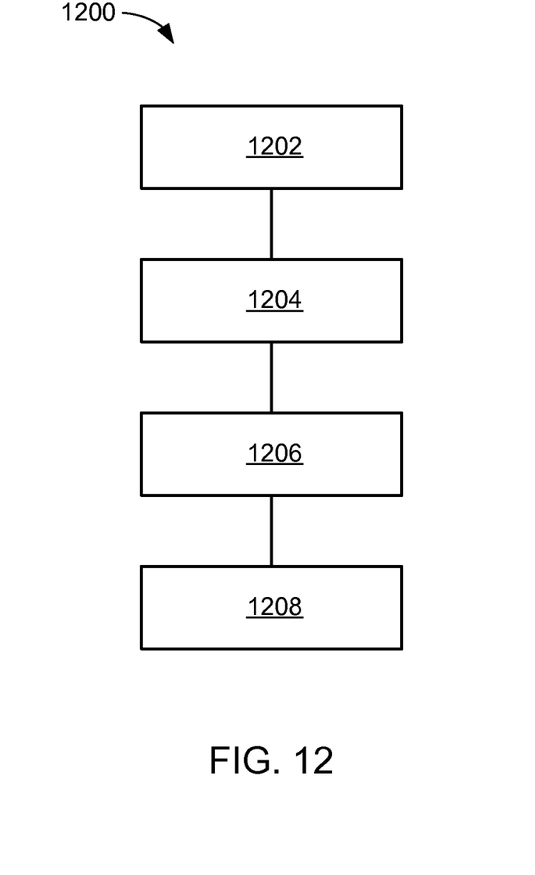
FIG. 12 is a flow chart of a method for manufacture of an integrated circuit packaging system of FIG. 1 in a further embodiment of the present invention.

Referring now to FIG. 12, therein is shown a flow chart of a method 1200 for manufacture of an integrated circuit packaging system 100 of FIG. 1 in a further embodiment of the present invention. The method 1200 includes: providing a substrate in a block 1202; connecting an integrated circuit die in a block 1204; forming a molding having a temperature-dependent characteristic directly on the top surface of the substrate in a block 1206; and forming a coupling encapsulation having a coupled characteristic different from the temperature-dependent characteristic directly on the molding forms an encapsulation boundary between the coupling encapsulation and the molding in a block 1208.

Yet other important aspects of the embodiments include that it valuably supports and services the historical trend of reducing costs, simplifying systems, and increasing performance.

These and other valuable aspects of the embodiments consequently further the state of the technology to at least the next level.

Thus, it has been discovered that the integrated circuit packaging system of the present invention furnishes important and heretofore unknown and unavailable solutions, capabilities, and functional aspects for improving reliability in systems. The resulting processes and configurations are straightforward, cost-effective, uncomplicated, highly versatile, and effective, can be implemented by adapting known technologies, and are thus readily suited for efficiently and economically manufacturing integrated circuit packaging system.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit packaging system comprising:
a substrate;
an integrated circuit die connected to the substrate;
a molding having a temperature-dependent characteristic formed directly on a top surface of the substrate, the molding exposes a perimeter portion of the substrate from the molding;
a coupling encapsulation having a coupled characteristic different from the temperature-dependent characteristic, with the coupling encapsulation formed directly on the molding; and
an encapsulation boundary formed between and directly on the molding and the coupling encapsulation the encapsulation boundary includes:
a non-vertical surface extending in a non-vertical direction from the integrated circuit die toward the perimeter portion of the substrate, and
a non-horizontal surface integral with the non-vertical surface and directly on the substrate, with the non-horizontal surface and the non-vertical surface forming a protruding corner.

2. The system as claimed in claim 1 wherein:
the temperature-dependent characteristic includes a base shrinkage; and
the coupled characteristic includes a coupled shrinkage different from the base shrinkage.

3. The system as claimed in claim 1 wherein:
the temperature-dependent characteristic includes a transition temperature; and
the coupled characteristic includes a selected transition level different from the transition temperature.

4. An integrated circuit packaging system comprising:
a substrate;
an integrated circuit die connected to the substrate;
a molding having a temperature-dependent characteristic formed directly on a top surface of the substrate, wherein the molding is directly on a perimeter portion of the substrate, with the molding having a primary top surface;
a coupling encapsulation having a coupled characteristic different from the temperature-dependent characteristic, with the coupling encapsulation formed directly on the molding, the coupling encapsulation includes a coupling top surface coplanar with the primary top surface; and
an encapsulation boundary formed between and directly on the molding and the coupling encapsulation, the encapsulation boundary extends in a non-horizontal direction and surrounding the integrated circuit die.

5. The system as claimed in claim 4 wherein the encapsulation boundary includes an irregular surface portion abutting the encapsulation boundary and between the molding and the coupling encapsulation.

6. The system as claimed in claim 4 wherein:
the temperature-dependent characteristic includes a base shrinkage; and
the coupled characteristic includes a coupled shrinkage different from the base shrinkage.

7. The system as claimed in claim 4 wherein:
the temperature-dependent characteristic includes a transition temperature; and
the coupled characteristic includes a selected transition level different from the transition temperature.

8. An integrated circuit packaging system comprising:
a substrate;
an integrated circuit die connected to the substrate;
a molding having a temperature-dependent characteristic formed directly on a top surface of the substrate;
a coupling encapsulation having a coupled characteristic different from the temperature-dependent characteristic, with the coupling encapsulation formed directly on the molding;
an encapsulation boundary formed between and directly on the molding and the coupling encapsulation;
an external interconnect attached directly on the substrate on a surface opposite the integrate circuit die; and
an internal interconnect connecting the integrated circuit die to the substrate; and
wherein the encapsulation boundary is directly on the internal interconnect.

9. The system as claimed in claim 8 wherein:

the temperature-dependent characteristic includes a base shrinkage; and the coupled characteristic includes a coupled shrinkage different from the base shrinkage.

10. The system as claimed in claim 8 wherein:

the temperature-dependent characteristic includes a transition temperature; and the coupled characteristic includes a selected transition level different from the transition temperature.

* * * * *